United States Patent
Park et al.

(10) Patent No.: US 11,031,295 B2
(45) Date of Patent: Jun. 8, 2021

(54) GATE CAP LAST FOR SELF-ALIGNED CONTACT

(71) Applicant: International Business Machines Corporation, Armonk, NY (US)

(72) Inventors: Chanro Park, Clifton Park, NY (US); Kangguo Cheng, Schenectady, NY (US); Ruilong Xie, Niskayuna, NY (US); Choonghyun Lee, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 86 days.

(21) Appl. No.: 16/429,371

(22) Filed: Jun. 3, 2019

(65) Prior Publication Data
US 2020/0381306 A1  Dec. 3, 2020

(51) Int. Cl.
| | |
|---|---|
| *H01L 27/088* | (2006.01) |
| *H01L 21/8234* | (2006.01) |
| *H01L 21/768* | (2006.01) |
| *H01L 29/78* | (2006.01) |
| *H01L 21/311* | (2006.01) |
| *H01L 29/66* | (2006.01) |

(52) U.S. Cl.
CPC ........ *H01L 21/823475* (2013.01); *H01L 21/31111* (2013.01); *H01L 21/76831* (2013.01); *H01L 21/76832* (2013.01); *H01L 21/823431* (2013.01); *H01L 27/0886* (2013.01); *H01L 29/66795* (2013.01); *H01L 29/785* (2013.01)

(58) Field of Classification Search
USPC .................................................. 257/401
See application file for complete search history.

(56) References Cited

U.S. PATENT DOCUMENTS

| | | | |
|---|---|---|---|
| 8,084,311 B1 | 12/2011 | Horak et al. | |
| 8,614,123 B2 | 12/2013 | Wei et al. | |
| 8,846,513 B2 | 9/2014 | Baars et al. | |
| 8,927,407 B2 | 1/2015 | Baars et al. | |
| 9,064,801 B1* | 6/2015 | Horak | H01L 29/66545 |
| 9,093,467 B1 | 7/2015 | Xie et al. | |
| 9,177,956 B2 | 11/2015 | Cheng et al. | |
| 9,184,263 B2 | 11/2015 | Cai et al. | |
| 9,627,514 B1 | 4/2017 | Kim et al. | |

(Continued)

FOREIGN PATENT DOCUMENTS

| | | |
|---|---|---|
| JP | 2001196454 A | 7/2001 |

*Primary Examiner* — Niki H Nguyen
(74) *Attorney, Agent, or Firm* — Cantor Colburn LLP; Douglas Pearson

(57) ABSTRACT

Embodiments of the present invention are directed to a gate cap last process for forming a self-aligned contact. This gate cap last process allows for a thin SAC cap, as the SAC cap only needs to prevent a short between the metallization contact and the gate. In a non-limiting embodiment of the invention, a gate is formed over a channel region of a fin. The gate can include a gate spacer. A sacrificial contact is formed on a top surface of a source or drain (S/D) region of a substrate. The sacrificial contact is positioned directly adjacent to a sidewall of the gate spacer. An exposed surface of the gate is recessed to form a recessed gate surface and a self-aligned contact (SAC) cap is formed on the recessed gate surface. The sacrificial contact is replaced with a S/D contact.

14 Claims, 11 Drawing Sheets

(56) References Cited

U.S. PATENT DOCUMENTS

| | | |
|---|---|---|
| 9,716,037 B2 | 7/2017 | Golanzka et al. |
| 9,721,897 B1 | 8/2017 | Cheng et al. |
| 10,008,385 B1 | 6/2018 | Jha et al. |
| 10,084,050 B2 | 9/2018 | Cheng et al. |
| 2016/0211251 A1* | 7/2016 | Liaw ................. H01L 21/76897 |
| 2017/0125586 A1* | 5/2017 | Lee ....................... H01L 29/785 |
| 2017/0373161 A1* | 12/2017 | Schroeder ........... H01L 21/7684 |
| 2018/0211874 A1* | 7/2018 | Basker ................ H01L 29/4966 |

* cited by examiner

GATE CAP LAST FOR SELF-ALIGNED CONTACT

BACKGROUND

The present invention generally relates to fabrication methods and resulting structures for semiconductor devices, and more specifically, to a gate cap last process for forming a self-aligned contact.

Traditional metal oxide semiconductor field effect transistor (MOSFET) fabrication techniques include process flows for constructing planar field effect transistors (FETs). A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, fin-type field effect transistors (finFETs) employ non-planar fin-shaped regions in which the channel, source, and drain regions of the finFET are formed. A gate runs along the sidewalls and a top surface of the channel portion of each fin, enabling fuller depletion in the channel region, and reducing short-channel effects due to steeper subthreshold swing (SS) and smaller drain induced barrier lowering (DIBL).

SUMMARY

Embodiments of the invention are directed to a gate cap last process for forming a self-aligned contact. This gate cap last process allows for a thin self-aligned contact (SAC) cap, as the SAC cap only needs to prevent a short between the metallization contact and the gate. A non-limiting example of the method includes forming a gate over a channel region of a fin. The gate can include a gate spacer. A sacrificial contact is formed on a top surface of a source or drain (S/D) region of a substrate. The sacrificial contact is positioned directly adjacent to a sidewall of the gate spacer. An exposed surface of the gate is recessed to form a recessed gate surface and a SAC cap is formed on the recessed gate surface. The sacrificial contact is replaced with a S/D contact.

Embodiments of the invention are directed to a gate cap last process for forming a self-aligned contact. This gate cap last process allows for a thin SAC cap, as the SAC cap only needs to prevent a short between the metallization contact and the gate. A non-limiting example of the method includes forming a S/D contact trench over a S/D region of a substrate. The S/D contact trench is enlarged by isotropically etching a dielectric layer. A sacrificial S/D contact material is deposited into the S/D contact trench. A gate is recessed and a SAC cap is formed on a recessed surface of the gate. The sacrificial S/D contact material is replaced with a S/D contact.

Embodiments of the invention are directed to a semiconductor structure. A non-limiting example of the semiconductor device includes a gate structure positioned over a channel region of a fin. The gate structure includes gate spacers and a SAC cap between the gate spacers. A S/D structure is self-aligned to the gate structure. The S/D structure includes a source or drain region adjacent to the channel region and a S/D contact on the source or drain region. A sidewall of the S/D contact is coplanar to a sidewall of the gate spacers.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
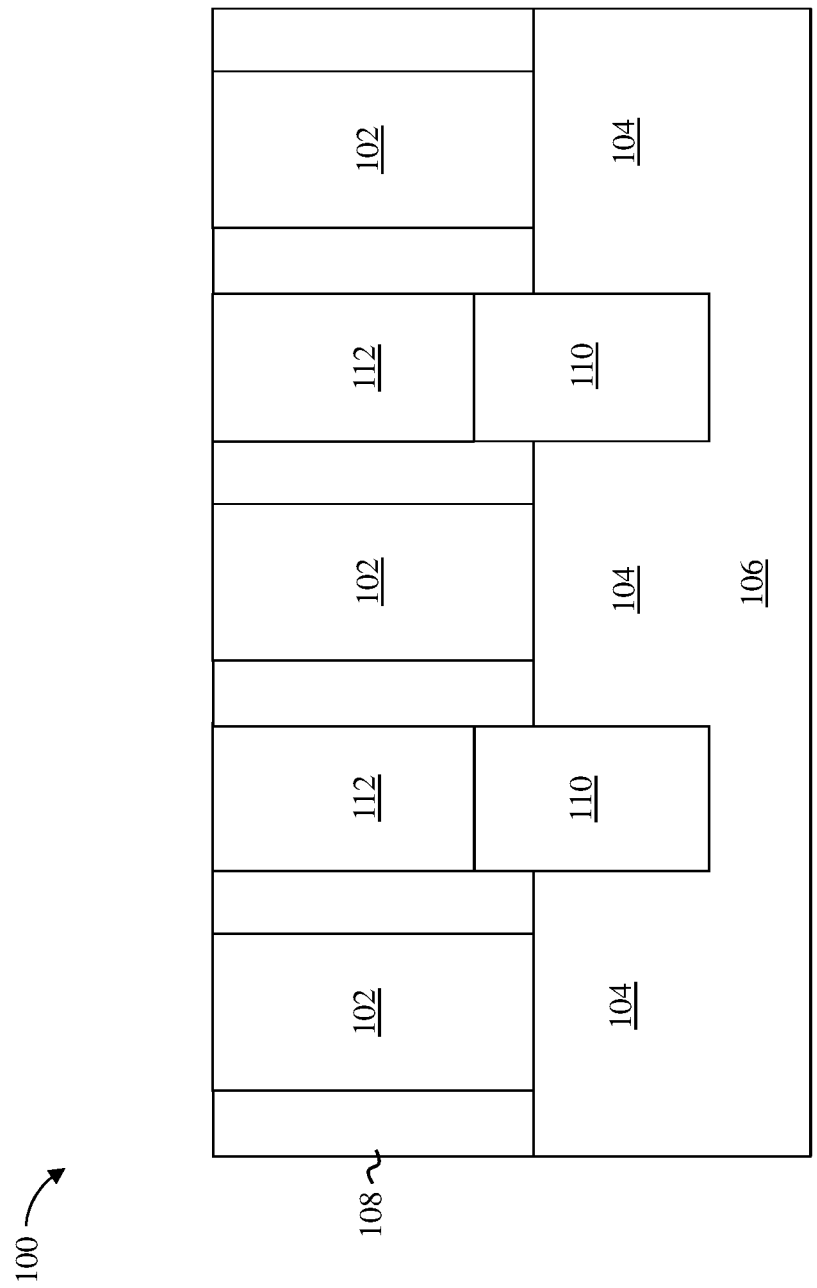
FIG. 1 depicts a cross-sectional view of a semiconductor structure after an initial set of processing operations according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, middle-of-line (MOL) finFET fabrication processes can be based on self-aligned contact (SAC) or non-SAC process flows. Recently, the industry has moved to a non-SAC MOL because the process is relatively easy and low cost (with respect to SAC-based process flows) due in part to there being no need for complex modules such as work function metal (WFM) chamfering, gate recess, SAC cap formation, or self-aligned contact etching. In contrast, SAC-based process flows require thick SAC caps to ensure no source/drain contact-to-gate shorting and a highly selective SAC etch process. These conditions are becoming harder to meet as device dimensions become smaller. While the non-SAC process is simpler, it is extremely difficult to implement non-SAC processes beyond the 7 nm node, where gate pitch is less than 50 nm, without sacrificing contact resistance. Scaling pressures for finFET devices, however, require a post-7 nm solution.

Turning now to an overview of aspects of the present invention, one or more embodiments of the invention address the above-described shortcomings of the prior art by providing a gate cap last process for forming a self-aligned contact (i.e., SAC cap last). In some embodiments of the invention, the SAC caps are formed after the source/drain contacts are patterned. This is made possible in part by forming a small source/drain contact and enlarging the contact by an isotropic etching process. In some embodiments of the invention, dummy source/drain (S/D) contact material can be deposited into source/drain contact trenches. The dummy S/D contact material is polished to expose gate metal(s). The gate metal (e.g., WFM) is recessed. The top surface of the recessed gate is covered with capping material, and the capping material is polished to expose the dummy source/drain material. The dummy S/D material can be selectively removed and replaced with S/D contacts during a S/D metallization module.

This SAC cap last process flow offers several advantages over both non-SAC and SAC processes. With respect to non-SAC processes, the source/drain contacts can be larger, and contact resistance is not sacrificed. With respect to SAC-based processes, the gate metal recess depth does not need to be as deep, as the source/drain contact is already formed prior to the gate metal recess. In other words, the SAC cap itself is only needed to prevent a metallization contact-to-gate short (as a source/drain contact-to-gate short is not possible). This allows for thinner SAC caps. Conventional SAC caps prevent shorting between the source/drain contacts and gate as well as shorting between the metallization contact (the source/drain metallization layer contact) and gate. As a result, these prior SAC processes require relatively thick SAC caps.

Turning now to a more detailed description of aspects of the present invention, FIGS. 1-9 depict cross-sectional views of a semiconductor structure 100 after fabrication operations have been performed in accordance with embodiments of the invention to form a final semiconductor device. In embodiments of the invention, the final semiconductor device can be a variety of types of MOSFETs, including, for example, non-planar n-type field effect transistors (NFET) and p-type field effect transistors (PFET). For example, the final semiconductor device can be an n-type finFET or a p-type finFET. While described with respect to the finFET transistor architecture for ease of illustration, it is understood that the method can be applied to other transistor architectures, such as, for example, planar, nanosheet or gate-all-around transistor architectures.

In the embodiment of the invention shown in FIG. 1, the semiconductor structure 100 includes one or more gates 102 formed over channel regions of one or more fins 104. The fins 104 are formed on a substrate 106. The fins 104 can be formed on the substrate 106 using known FEOL finFET fabrication techniques. The substrate 106 and the fins 104 can be made of any suitable semiconductor material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the invention, the substrate 106 and the fins 104 can be made of the same semiconductor material. In other embodiments of the invention, the substrate 106 can be made of a first semiconductor material, and the fins 104 can be made of a second semiconductor material. In some embodiments of the invention, the substrate 106 and the fins 104 can be made of silicon or SiGe. In some embodiments of the invention, the substrate 106 is silicon and the fins 104 are silicon germanium having a germanium concentration of about 10 to about 80 percent. The fins 104 can each have a height ranging from 4 nm to 150 nm. In some embodiments of the present invention, the fins 104 are formed to a height of about 60 nm, although other fin heights are within the contemplated scope of the invention.

In some embodiments of the invention, the substrate 106 can include a buried oxide layer (not depicted). The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention. In some embodiments of the invention, the semiconductor structure 100 can be electrically isolated from other regions of the substrate 106 by shallow trench isolation (STI) regions (not depicted).

The one or more gates 102 can be high-k metal gates (HKMGs) formed over a channel region of the fins 104 using, for example, known replacement metal gate (RMG) processes, or so-called gate-first processes. The gates 102 can include a high-k dielectric material(s) (not shown) and a work function metal stack (not shown). In some embodiments, the gates 102 includes a main body formed from bulk conductive gate material(s).

In some embodiments of the invention, the gate dielectric is a high-k dielectric film formed on a surface (sidewall) of the fins 104. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention.

In some embodiments of the invention, the gates 102 include one or more work function layers (sometimes referred to as a work function metal stack) formed between the high-k dielectric film and a bulk gate material. In some embodiments of the invention, the gates 102 include one or more work function layers, but do not include a bulk gate material.

If present, the work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to modify the work function of the gates 102 and enables tuning of the device threshold voltage. The work function layers can be formed to a thickness of about 0.5 to 6 nm, although other thicknesses are within the contemplated scope of the invention. In some embodiments of the invention, each of the work function layers can be formed to a different thickness. In some embodiments of the invention, the work function layers include a TiN/TiC/TiCAl stack.

In some embodiments, the gates 102 includes a main body formed from bulk conductive gate material(s) deposited over the work function layers. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive gate material can further include dopants that are incorporated during or after deposition.

In some embodiments of the invention, spacers 108 (also known as sidewall spacers or gate spacers) are formed on sidewalls of the gates 102. In some embodiments of the invention, the spacers 108 are formed or patterned prior to forming source and drain regions 110. In some embodiments of the invention, the spacers 108 are formed on sidewalls of a dummy gate that is replaced by the gates 102 during an RMG process. In some embodiments of the invention, the spacers 108 are formed using a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, molecular beam epitaxy (MBE), or other like process in combination with a wet or dry etch process. For example, spacer material can be conformally deposited over the semiconductor structure 100 and selectively removed using a RIE to form the spacers 108. The spacers 108 can be made of any suitable material, such as, for example, a low-k dielectric, a nitride, silicon nitride, silicon oxide, SiON, SiC, SiOCN, or SiBCN. In some embodiments of the invention, the spacers 108 include silicon nitride. The spacers 108 can be formed to a thickness of about 5 to 40 nm, although other thicknesses are within the contemplated scope of the invention.

In some embodiments of the invention, the source and drain regions 110 can be epitaxially grown on exposed surfaces of the fins 104 and/or the substrate 106. In some embodiments of the invention, the source and drain regions 110 are formed to a thickness of about 4 nm to about 20 nm, for example 10 nm, although other thicknesses are within the contemplated scope of the invention. The source and drain regions 110 can be epitaxially grown using, for example, vapor-phase epitaxy (VPE), molecular beam epitaxy (MBE), liquid-phase epitaxy (LPE), or other suitable processes. The source and drain regions 110 can be semiconductor materials epitaxially grown from gaseous or liquid precursors.

In some embodiments of the invention, the gas source for the epitaxial deposition of semiconductor material includes a silicon containing gas source, a germanium containing gas source, or a combination thereof. For example, a Si layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxially grown silicon and silicon germanium can be doped by adding n-type dopants (e.g., P or As) or p-type dopants (e.g., Ga, B, $BF_2$, or Al). In some embodiments of the invention, the source and drain regions 110 can be epitaxially formed and doped by a variety of methods, such as, for example, in-situ doped epitaxy (doped during deposition), doped following the epitaxy, or by implantation and plasma doping. The dopant concentration in the doped regions can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

In some embodiments of the invention, the source and drain regions 110 are made of silicon germanium. In some embodiments of the invention, the source and drain regions 110 are made of silicon germanium having a germanium concentration of about 10 to about 65 percent, for example, 50 percent, although other germanium concentrations are within the contemplated scope of the invention. In some embodiments of the invention of the invention, the source and drain regions 110 can extend above a topmost surface of the fins 104.

In some embodiments of the invention, a dielectric layer 112 can be formed over the semiconductor structure 100. The dielectric layer 112 can be made of any suitable dielectric material, such as, for example, porous silicates, carbon doped oxides, silicon dioxides, silicon nitrides, silicon oxynitrides, a low or ultra-low k dielectric material, or other dielectric materials. Any known manner of forming the dielectric layer 112 can be utilized, such as, for example, CVD, PECVD, ALD, flowable CVD, spin-on dielectrics, or PVD. In some embodiments of the invention, the dielectric layer 112 and the STI region are made of the same dielectric material, and together define a single continuous dielectric region. In some embodiments of the invention, the dielectric layer 112 is formed prior to a dummy gate pull and the formation of the gates 102.

Figure 2:
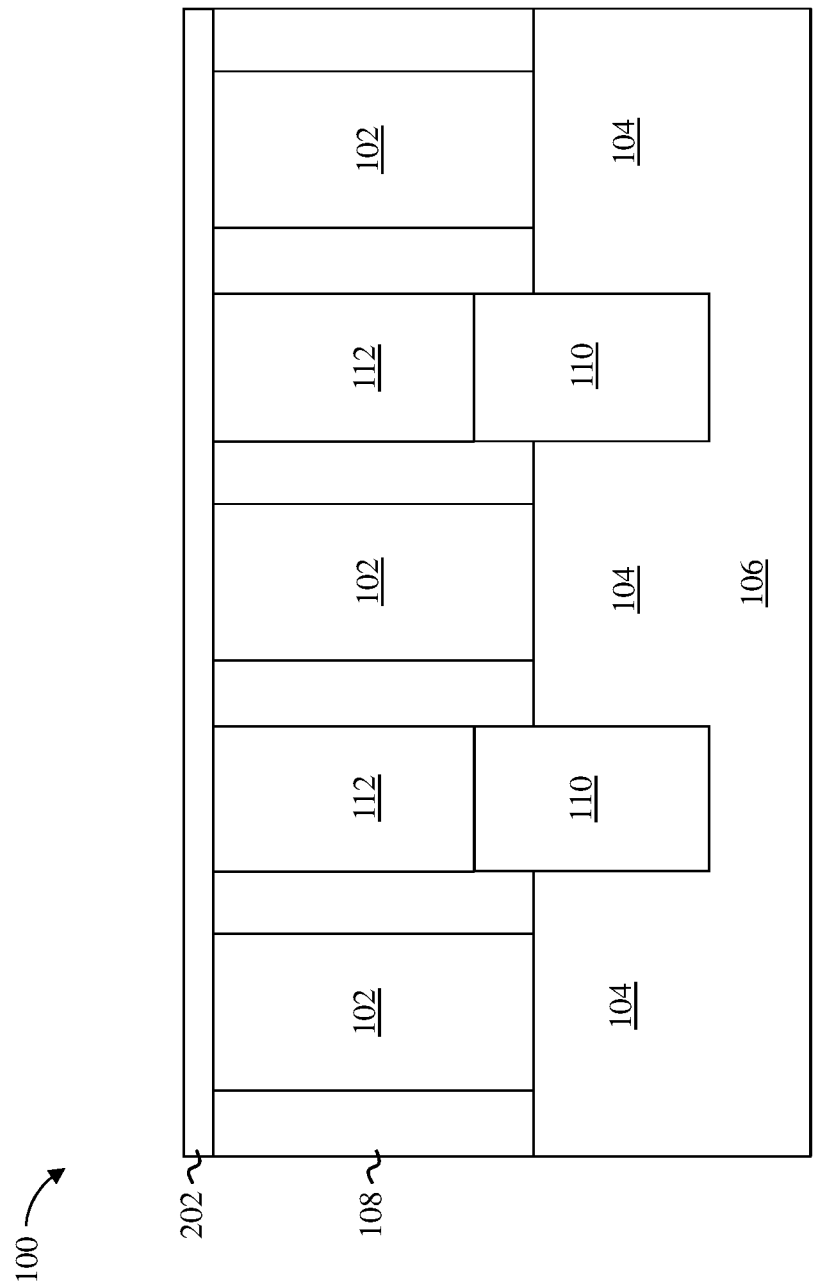
FIG. 2 depicts a cross-sectional view of the semiconductor structure after additional processing operations according to one or more embodiments of the invention.
Figure 4:
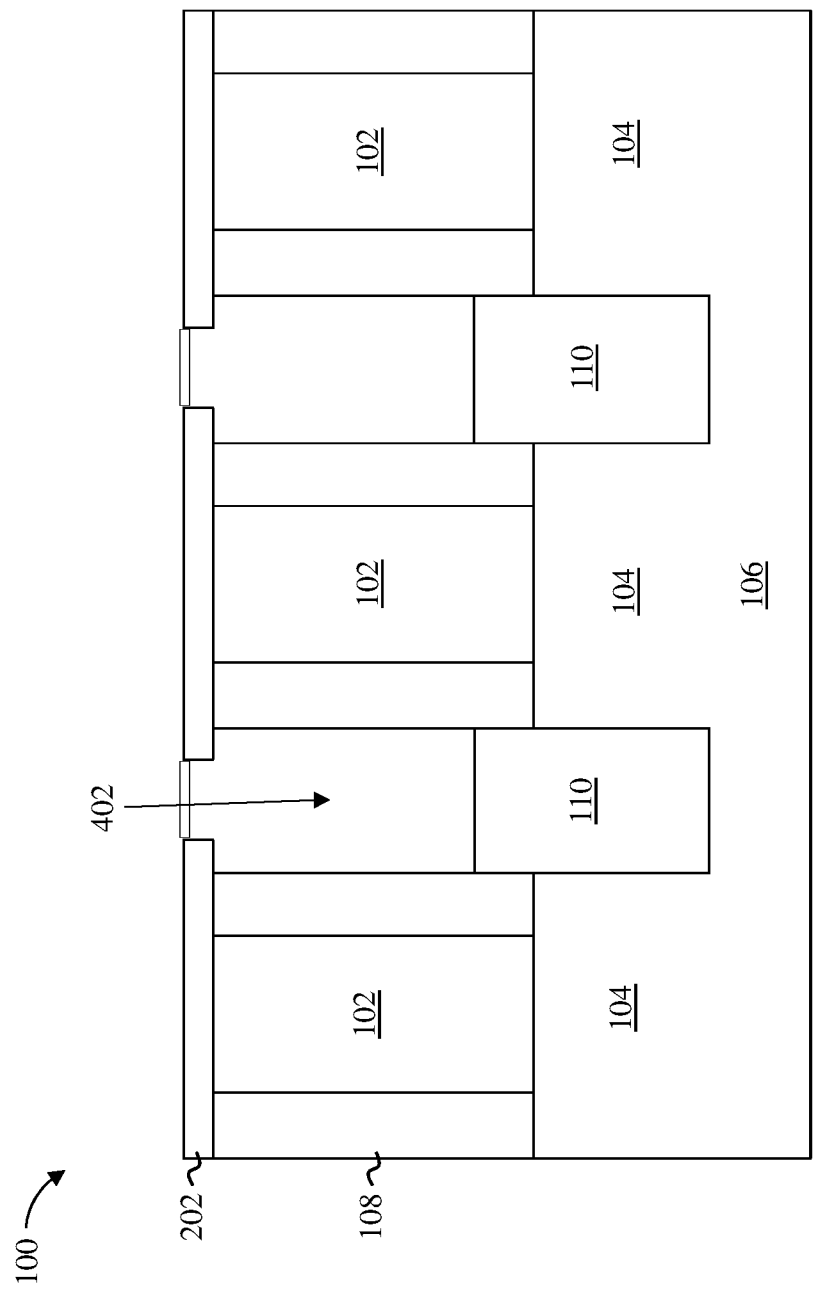
FIG. 4 depicts a cross-sectional view of the semiconductor structure after additional processing operations according to one or more embodiments of the invention.

FIG. 2 depicts a cross-sectional view of the semiconductor structure 100 after a processing operation according to one or more embodiments of the invention. As illustrated in FIG. 2, a liner 202 is formed over the semiconductor structure 100 after the process steps depicted in FIG. 1. The liner 202 protects portions of the dielectric layer 112 that are outside the source/drain contact area during a subsequent isotropic etch (FIG. 4).

In some embodiments of the invention, the liner 202 is deposited over a surface of the dielectric layer 112, a surface of the spacers 108, and a surface of the gates 102. In some embodiments of the invention, the liner 202 is formed using a CVD, PECVD, UHVCVD, RTCVD, MOCVD, LPCVD, LRPCVD, ALD, PVD, chemical solution deposition, MBE, or other like process. The liner 202 can be made of any suitable material, such as, for example, a low-k dielectric, a nitride, silicon nitride, SiON, SiC, SiOCN, or SiBCN. In some embodiments of the invention, the liner 202 includes silicon nitride. The liner 202 can be formed to a thickness of less than about 10 nm, for example, 5 nm, although other thicknesses are within the contemplated scope of the invention.

Figure 3:
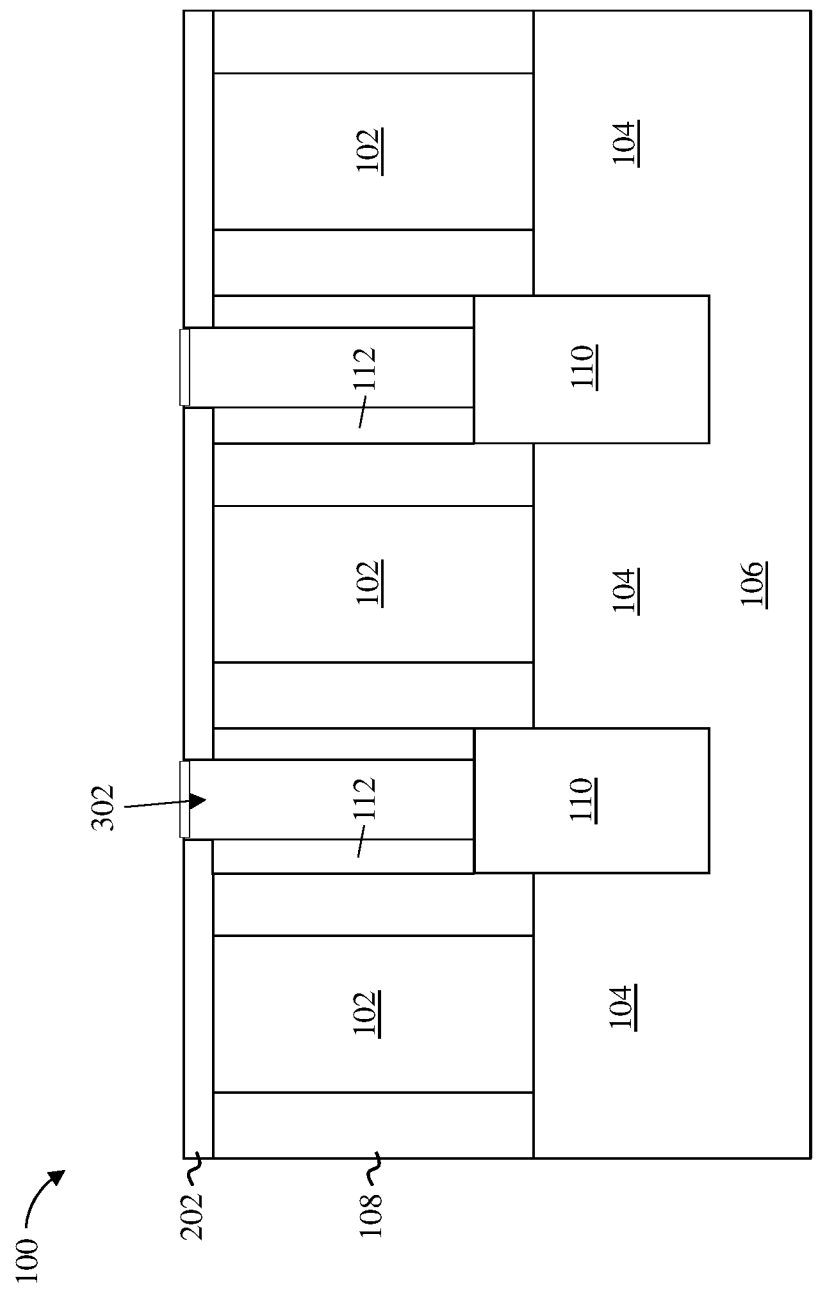
FIG. 3 depicts a cross-sectional view of the semiconductor structure after additional processing operations according to one or more embodiments of the invention.

FIG. 3 depicts a cross-sectional view of the semiconductor structure 100 after a processing operation according to one or more embodiments of the invention. As illustrated in FIG. 3, portions of the liner 202 and portions of the dielectric layer 112 are removed to form a trench 302 exposing a surface of the source and drain regions 110. In some embodiments of the invention, the width of the trench 302 is restricted such that sidewalls of the spacers 108 remain covered by the dielectric layer 112.

Portions of the liner 202 and the dielectric layer 112 can be removed using any suitable method, such as a wet etch, a dry etch, or a combination of sequential wet and/or dry etches. In some embodiments of the invention, the liner 202 and the dielectric layer 112 are etched selective to the source and drain regions 110.

FIG. 4 depicts a cross-sectional view of the semiconductor structure 100 after a processing operation according to one or more embodiments of the invention. As illustrated in FIG. 4, remaining portions (second portions) of the dielectric layer 112 inside the contact area are removed to form an enlarged trench 402 exposing sidewalls of the spacers 108. As discussed previously herein, the liner 202 prevents inadvertent erosion of the dielectric layer 112 in areas outside the contact area (e.g., in other regions of the substrate 106).

The dielectric layer 112 can be removed using any suitable method, such as a wet etch, a dry etch, or a combination of sequential wet and/or dry etches. In some embodiments of the invention, the dielectric layer 112 is etched selective to the source and drain regions 110 and/or the spacers 108. For example, an oxide (e.g., $SiO_2$) can be etched using a directional RIE (or anisotropic etch) selective to the spacer material (e.g., silicon nitride).

Figure 5:
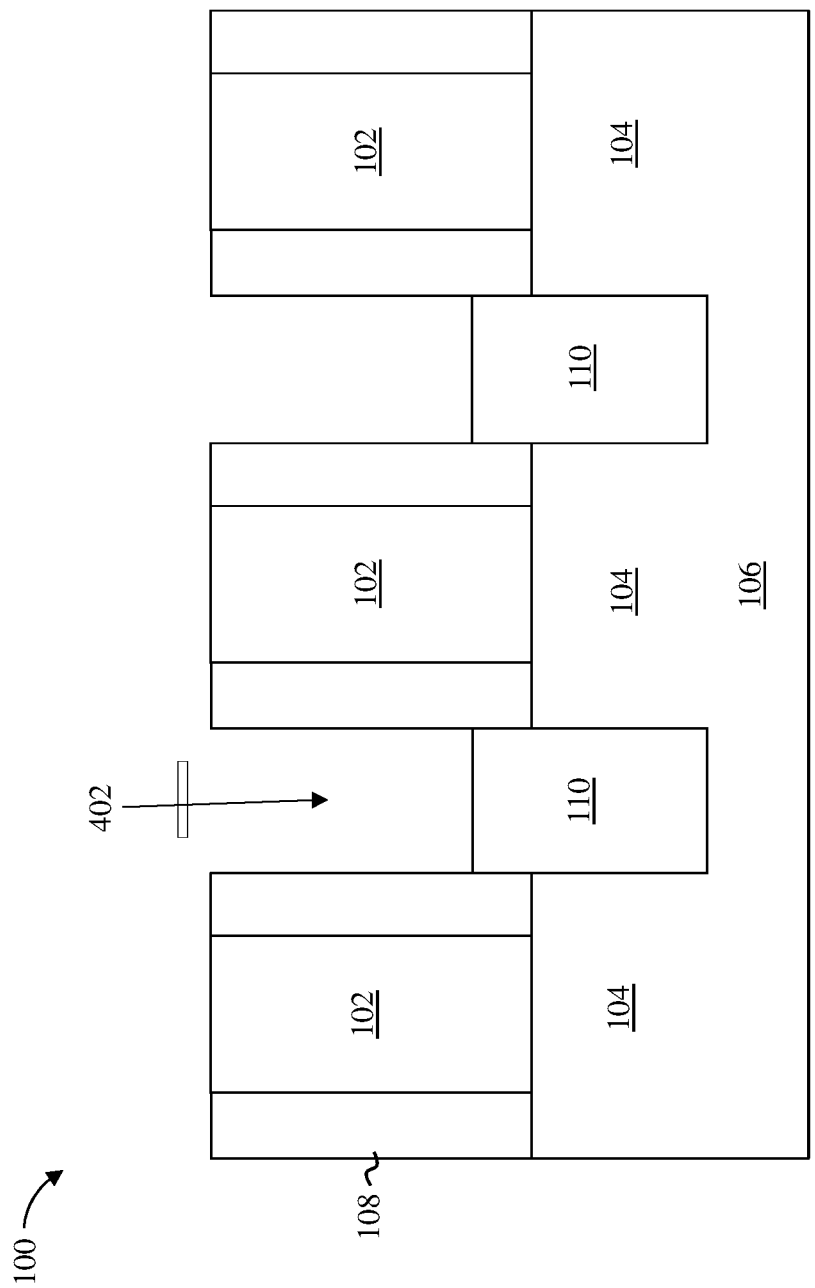
FIG. 5 depicts a cross-sectional view of the semiconductor structure after additional processing operations according to one or more embodiments of the invention.

FIG. 5 depicts a cross-sectional view of the semiconductor structure 100 after a processing operation according to one or more embodiments of the invention. As illustrated in FIG. 5, remaining portions of the liner 202 are removed to expose a surface of the gates 102 and a surface of the spacers 108. The liner 202 can be removed using any suitable method, such as a wet etch, a dry etch, or a combination of sequential wet and/or dry etches. In some embodiments of the invention, the liner 202 is etched selective to the gates 102 and/or the spacers 108.

Figure 6:
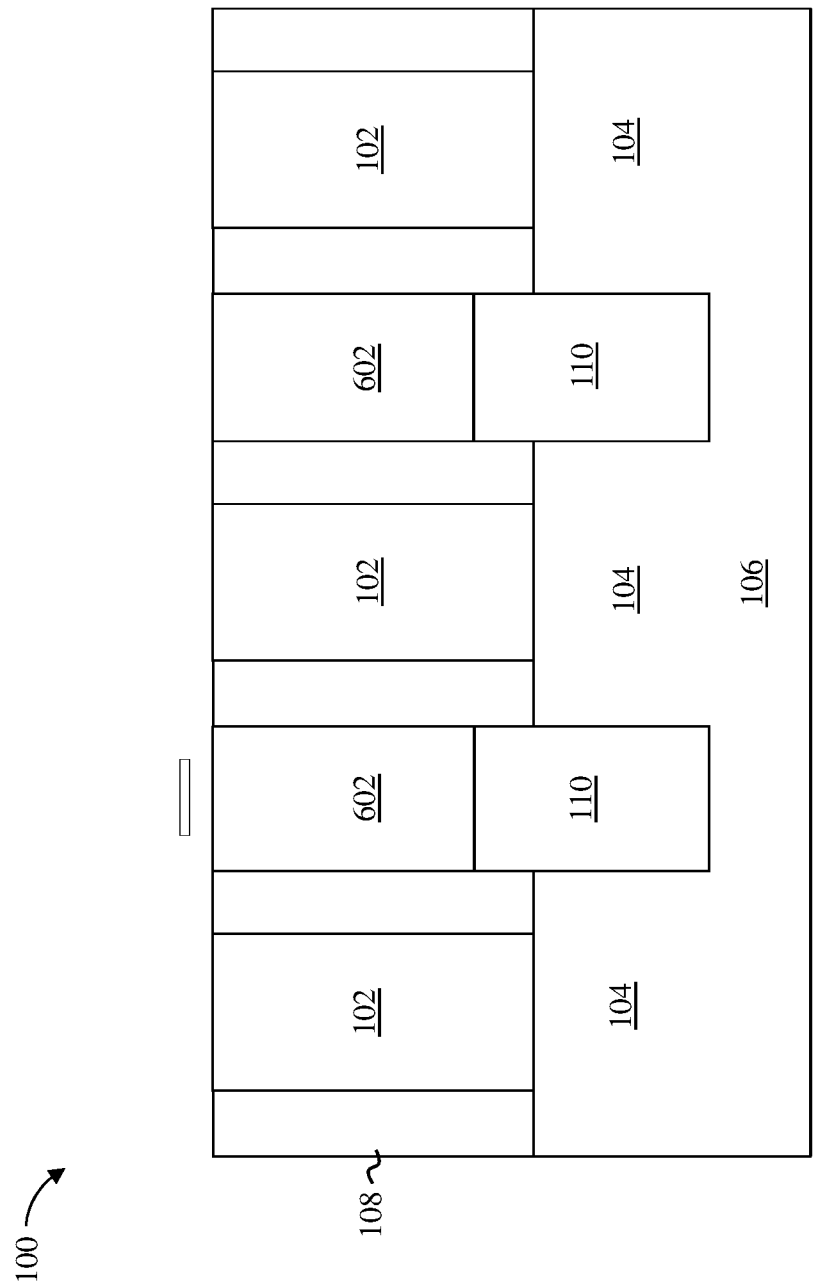
FIG. 6 depicts a cross-sectional view of the semiconductor structure after additional processing operations according to one or more embodiments of the invention.

FIG. 6 depicts a cross-sectional view of the semiconductor structure 100 after a processing operation according to one or more embodiments of the invention. As illustrated in FIG. 6, a sacrificial contact 602 (also referred to as a dummy source/drain contact) is formed in the trench 402. In some embodiments of the invention, the sacrificial contact 602 is formed using a CVD, PECVD, UHVCVD, RTCVD, MOCVD, LPCVD, LRPCVD, ALD, PVD, chemical solution deposition, MBE, or other like process. The sacrificial contact 602 can be made of any suitable sacrificial material, such as, for example, amorphous silicon, amorphous silicon germanium, or amorphous carbon. In some embodiments of the invention, voids or seams are formed in the sacrificial contact 602 during the deposition process. Advantageously, any voids or seams in the sacrificial material do not impact the final structure, so long as the top surface of the sacrificial contact 602 is sealed (ensuring that the source and drain regions 110 are fully covered).

Figure 7:
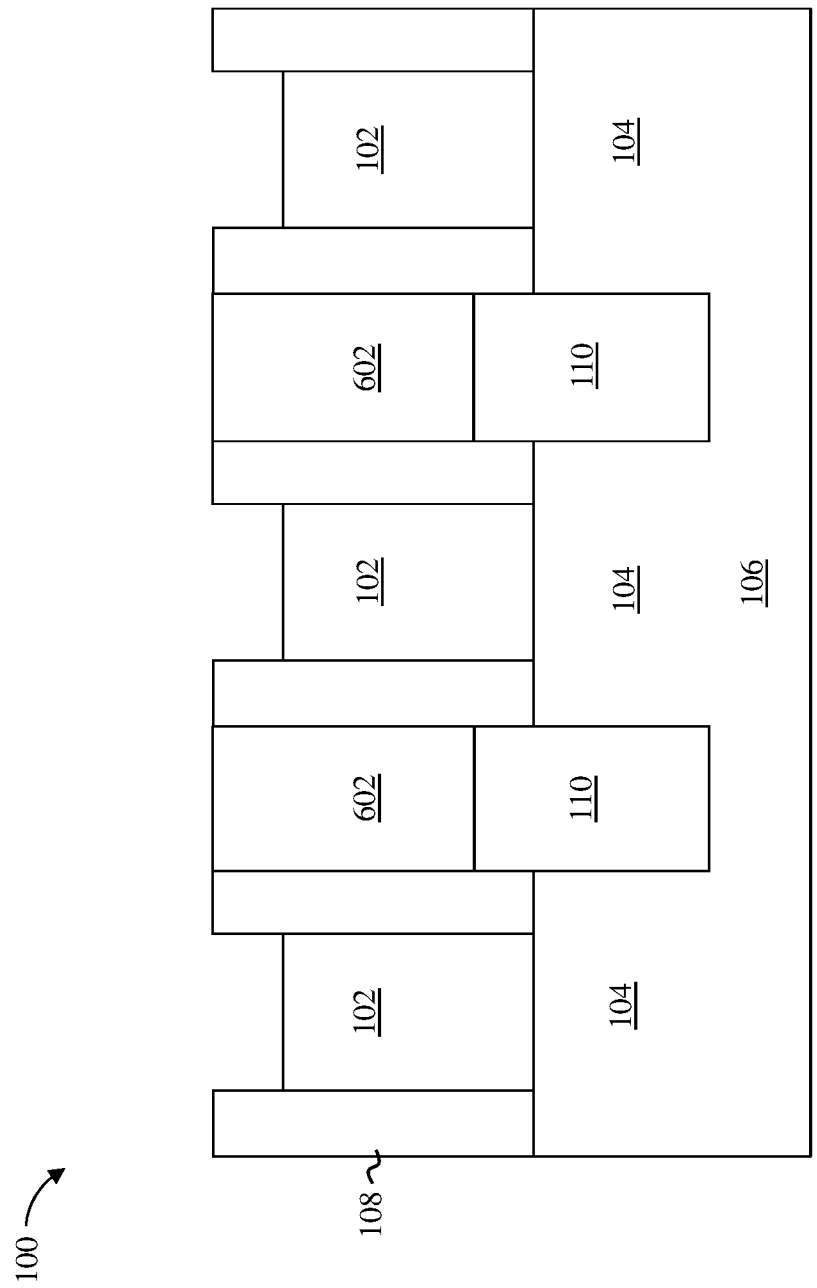
FIG. 7 depicts a cross-sectional view of the semiconductor structure after additional processing operations according to one or more embodiments of the invention.

FIG. 7 depicts a cross-sectional view of the semiconductor structure 100 after a processing operation according to one or more embodiments of the invention. As illustrated in FIG. 7, the gates 102 can be recessed. In some embodiments of the invention, this process is referred to as a WFM recess. The gates 102 can be recessed using any suitable method, such as a wet etch, a dry etch, or a combination of sequential wet and/or dry etches. In some embodiments of the invention, the gates 102 are recessed selective to the spacers 108. As discussed previously herein, the recess depth of the gates 102 can be less than or equal to about 30 nm, for example 15 nm, although other recess depths are within the contemplated scope of the invention. This shallow depth is possible because the sacrificial contact 602 has already been formed, preventing a short to the source and drain regions 110.

Figure 8:
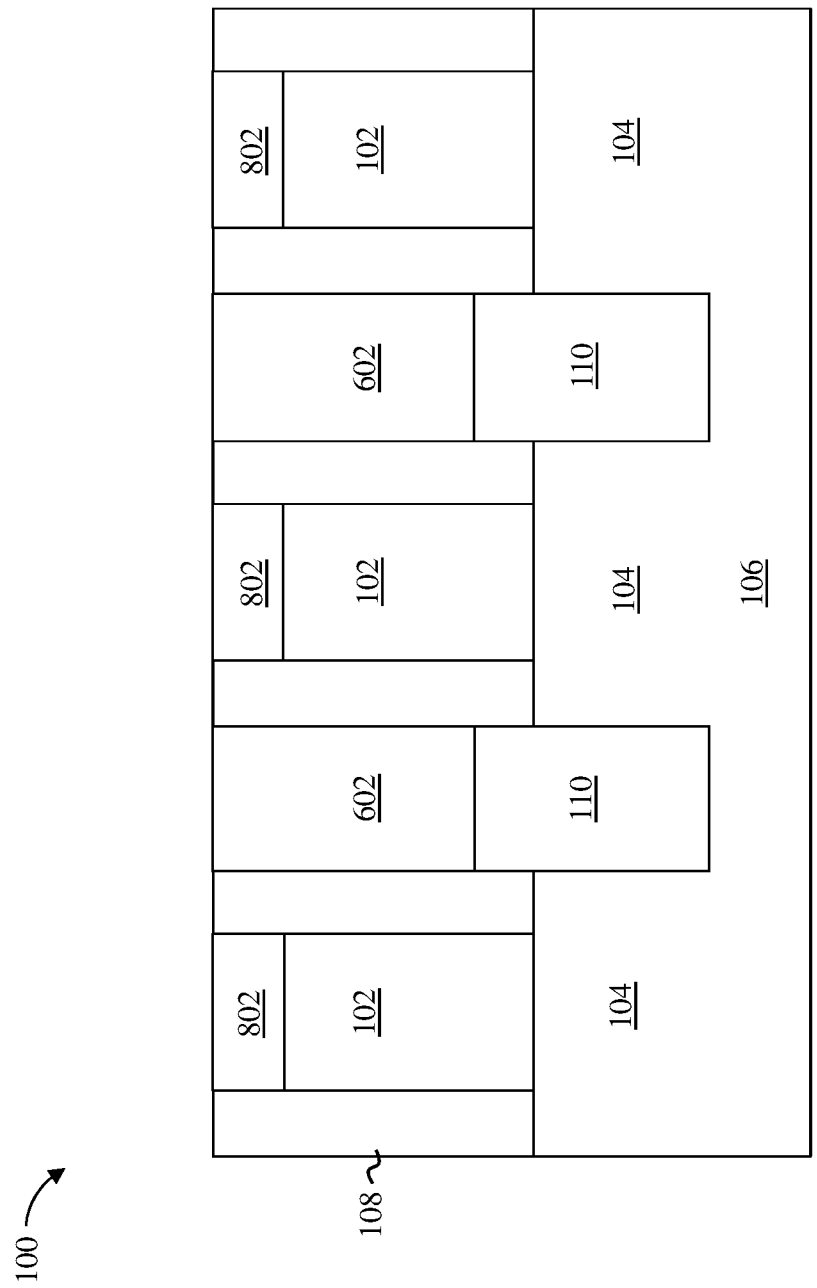
FIG. 8 depicts a cross-sectional view of the semiconductor structure after additional processing operations according to one or more embodiments of the invention.

FIG. 8 depicts a cross-sectional view of the semiconductor structure 100 after a processing operation according to one or more embodiments of the invention. As illustrated in FIG. 8, a SAC cap 802 can be formed on a recessed surface of the gates 102. The SAC cap 802 prevents a short between the gates 102 and the source/drain metallization layer contact 906 (depicted in FIG. 9). In some embodiments of the invention, the SAC cap 802 is formed using a CVD, PECVD, UHVCVD, RTCVD, MOCVD, LPCVD, LRPCVD, ALD, PVD, chemical solution deposition, MBE, or other like process. The SAC cap 802 can be made of any suitable dielectric material, such as, for example, a low-k dielectric, a nitride, silicon nitride, silicon oxide, SiON, SiC, SiOCN, or SiBCN. In some embodiments of the invention, the SAC cap 802 includes silicon nitride. The SAC cap 802 can be formed to a thickness of about 15 nm, although other thicknesses are within the contemplated scope of the invention. In some embodiments of the invention, the SAC cap 802 can be formed to a thickness of 2 nm to 10 nm, for example 5 nm.

Figure 9:
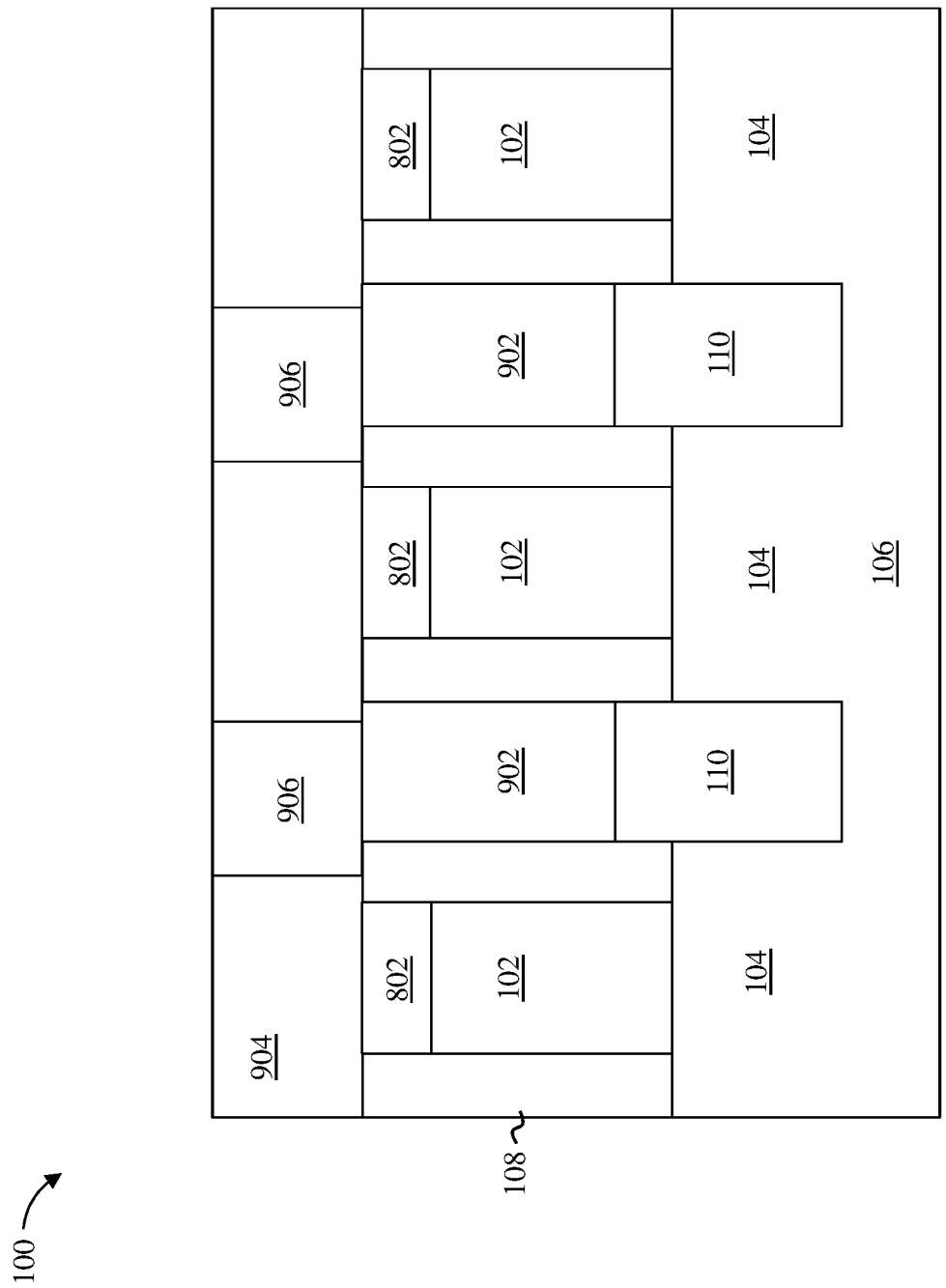
FIG. 9 depicts a cross-sectional view of the semiconductor structure after additional processing operations according to one or more embodiments of the invention.

FIG. 9 depicts a cross-sectional view of the semiconductor structure 100 after a processing operation according to one or more embodiments of the invention. As illustrated in FIG. 9, the sacrificial contact 602 can be replaced with source/drain contacts 902. In some embodiments of the invention, the sacrificial contact 602 is removed using a wet etch, a dry etch, or a combination of sequential wet and/or dry etches. In some embodiments of the invention, the sacrificial contact 602 is removed selective to the spacers 108. For example, amorphous silicon can be removed selective to silicon nitride via an ashing process.

The source/drain contacts 902 can be formed or deposited using known metallization techniques. In some embodiments of the invention, the source/drain contacts 902 are overfilled above a surface of the SAC cap 802. The source/drain contacts 902 can be made of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the source/drain contacts 902 are cobalt or tungsten contacts. The conductive material can further include dopants that are incorporated during or after deposition. In some embodiments of the invention, the source/drain contacts 902 can include a barrier metal liner (not depicted). Material examples include tantalum nitride and tantalum (TaN/Ta), titanium, titanium nitride, cobalt, ruthenium, and manganese.

In some embodiments of the invention, the source/drain contacts 902 are planarized after the deposition process, using for example, a chemical-mechanical planarization (removing the overburden). In some embodiments of the invention, the planarization process is configured to stop on the spacers 108. In other words, the source/drain contacts 902 can be planarized to a surface of the spacers 108. In some embodiments of the invention, this planarization process can result in a recessing (thinning) of the SAC cap 802.

In some embodiments of the invention, an interlayer dielectric 904 can be formed over the semiconductor structure 100. The interlayer dielectric 904 can be made of any suitable dielectric material, such as, for example, porous silicates, carbon doped oxides, silicon dioxides, silicon nitrides, silicon oxynitrides, a low or ultra-low k dielectric material, or other dielectric materials. Any known manner of forming the interlayer dielectric 904 can be utilized, such as, for example, CVD, PECVD, ALD, flowable CVD, spin-on dielectrics, or PVD. In some embodiments of the invention, the interlayer dielectric 904 and the dielectric layer 112 are made of the same dielectric material.

In some embodiments of the invention, a source/drain metallization layer contact 906 (also referred to as a metallization contact) is formed in the interlayer dielectric 904. The contact 906 can be formed or deposited using known metallization techniques. The contacts 906 can be made of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the contact 906 includes cobalt or tungsten. The conductive material can further include dopants that are incorporated during or after deposition. In some embodiments of the invention, the contact 906 can include a barrier metal liner (not depicted). Material examples include tantalum nitride and tantalum (TaN/Ta), titanium, titanium nitride, cobalt, ruthenium, and manganese.

Figure 10:
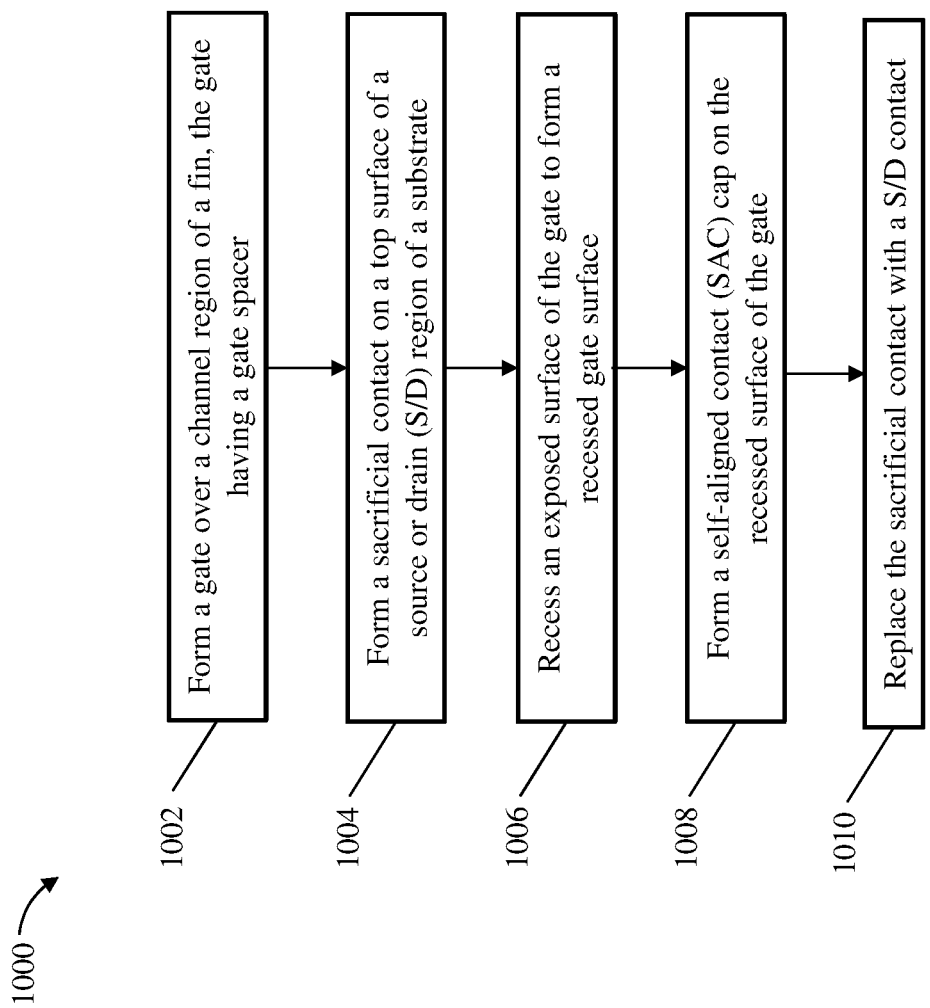
FIG. 10 depicts a flow diagram illustrating a method according to one or more embodiments of the invention.

FIG. 10 depicts a flow diagram 1000 illustrating a method for forming a semiconductor device according to one or more embodiments of the invention. As shown at block 1002, a gate is formed over a channel region of a fin. The gate can include a gate spacer.

At block 1404, a sacrificial contact is formed on a top surface of a source or drain (S/D) region of a substrate. In some embodiments of the invention, the S/D region is formed adjacent to a first end of the channel region. The sacrificial contact is positioned directly adjacent to a sidewall of the gate spacer. In some embodiments of the invention, forming the sacrificial contact includes forming a dielectric layer on the top surface of the S/D region. The dielectric layer can be positioned to directly contact a sidewall of the gate spacer. A liner can be formed over the gate, the gate spacer, and the dielectric layer and portions of the liner and first portions of the dielectric layer can be removed to expose the top surface of the S/D region. In some embodiments of the invention, forming the sacrificial contact further includes removing second portions of the dielectric layer selective to the liner to expose the sidewall of the gate spacer and depositing sacrificial material on the top surface of the S/D region. As discussed previously herein, removing the first portions of the dielectric layer does not expose sidewalls of the gate spacer (as shown in FIG. 3).

At block 1406, the gate is recessed. The gate can be recessed in a similar manner as described herein with respect to FIG. 7. At block 1408, a SAC cap is formed on a recessed surface of the gate. The SAC cap can be formed in a similar manner as described herein with respect to FIG. 8.

At block 1410, the sacrificial contact is replaced with a S/D contact. In some embodiments of the invention, a surface of the SAC cap is polished to expose a surface of the sacrificial contact so that the sacrificial contact can be removed. The S/D contact can be formed in a similar manner as described herein with respect to FIG. 9.

The method can further include forming a metallization layer contact on a top surface of the S/D contact. In some embodiments of the invention, the SAC cap prevents a short between the gate and the metallization layer contact.

Figure 11:
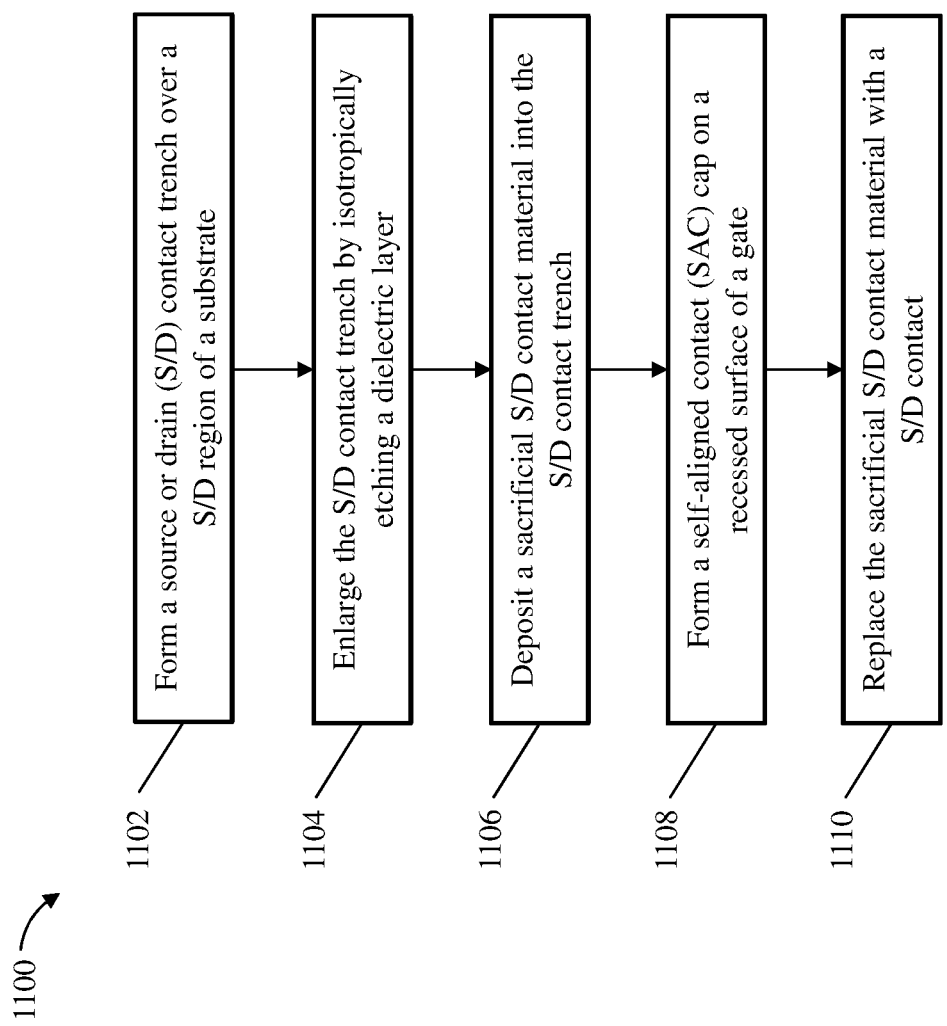
FIG. 11 depicts a flow diagram illustrating a method according to one or more embodiments of the invention.

FIG. 11 depicts a flow diagram 1100 illustrating a method for forming a semiconductor device according to one or more embodiments of the invention. As shown at block 1102, a S/D contact trench is formed over a S/D region of a substrate. The S/D contact trench can be formed in a similar manner as described herein with respect to FIG. 3. At block 1104, the S/D contact trench is enlarged by isotropically etching a dielectric layer. The S/D contact trench can be enlarged in a similar manner as described herein with respect to FIG. 4.

At block 1106, a sacrificial S/D contact material is deposited into the S/D contact trench. At block 1108, a SAC cap is formed on a recessed surface of a gate. At block 1110, the sacrificial S/D contact material is replaced with a S/D contact. In some embodiments of the invention, a surface of the SAC cap is polished to expose a surface of the sacrificial S/D contact material so that the sacrificial contact can be removed.

The method can further include forming a metallization layer contact on a top surface of the S/D contact. In some embodiments of the invention, the SAC cap prevents a short between the gate and the metallization layer contact. The method can further include, prior to forming the S/D contract trench, forming a liner over a surface of the dielectric layer.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:
1. A method for forming a semiconductor device, the method comprising:
   forming a gate over a channel region of a fin, the gate comprising a gate spacer;

forming a sacrificial contact on a top surface of a source or drain (S/D) region of a substrate, the sacrificial contact directly adjacent to a sidewall of the gate spacer;

recessing an exposed surface of the gate to form a recessed gate surface;

forming a self-aligned contact (SAC) cap on the recessed gate surface;

polishing to a surface of the SAC cap to expose a surface of the sacrificial contact; and replacing the sacrificial contact with a S/D contact.

2. The method of claim 1 further comprising forming a metallization layer contact on a top surface of the S/D contact.

3. The method of claim 2, wherein the SAC cap prevents a short between the gate and the metallization layer contact.

4. The method of claim 1 further comprising forming the S/D region adjacent to a first end of the channel region.

5. The method of claim 1, wherein forming the sacrificial contact comprises forming a dielectric layer on the top surface of the S/D region, the dielectric layer directly contacting the sidewall of the gate spacer.

6. The method of claim 5, wherein forming the sacrificial contact further comprises forming a liner over the gate, the gate spacer, and the dielectric layer.

7. The method of claim 6, wherein forming the sacrificial contact further comprises removing portions of the liner and first portions of the dielectric layer to expose the top surface of the S/D region.

8. The method of claim 7, wherein forming the sacrificial contact further comprises removing second portions of the dielectric layer selective to the liner to expose the sidewall of the gate spacer.

9. The method of claim 7, wherein removing first portions of the dielectric layer does not expose the sidewall of the gate spacer.

10. A method for forming a semiconductor device, the method comprising:

forming a source or drain (S/D) contact trench over a S/D region of a substrate;

enlarging the S/D contact trench by isotropically etching a dielectric layer;

depositing a sacrificial S/D contact material into the S/D contact trench;

forming a self-aligned contact (SAC) cap on a recessed surface of a gate; and replacing the sacrificial S/D contact material with a S/D contact.

11. The method of claim 10 further comprising forming a metallization layer contact on a top surface of the S/D contact.

12. The method of claim 11, wherein the SAC cap prevents a short between the gate and the metallization layer contact.

13. The method of claim 10 further comprising polishing to a surface of the SAC cap to expose a surface of the sacrificial S/D contact material.

14. The method of claim 10 further comprising, prior to forming the S/D contract trench, forming a liner over a surface of the dielectric layer.

* * * * *